United States Patent
Barnes et al.

(10) Patent No.: US 6,830,776 B1
(45) Date of Patent: Dec. 14, 2004

(54) METHOD OF MANUFACTURING A HIGH TEMPERATURE SUPERCONDUCTOR

(75) Inventors: Paul N. Barnes, West Milton, OH (US); Timothy J. Haugan, Dayton, OH (US)

(73) Assignee: The United States of America as represented by the Secretary of the Air Force, Washington, DC (US)

(*) Notice: Subject to any disclaimer, the term of this patent is extended or adjusted under 35 U.S.C. 154(b) by 146 days.

(21) Appl. No.: 10/355,635

(22) Filed: Jan. 31, 2003

Related U.S. Application Data

(60) Provisional application No. 60/355,994, filed on Feb. 8, 2002.

(51) Int. Cl.$^7$ .............................. B05D 5/12; C23C 14/08
(52) U.S. Cl. .......................... 427/63; 427/596; 427/597
(58) Field of Search .......................... 427/63, 561, 586, 427/258, 261, 265, 255.19, 596, 597, 62, 582

(56) References Cited

U.S. PATENT DOCUMENTS

| | | | |
|---|---|---|---|
| 5,231,076 A | | 7/1993 | Jeong et al. |
| 5,244,868 A | * | 9/1993 | Jin et al. ................. 505/450 |
| 5,248,660 A | * | 9/1993 | Lee et al. ................. 505/450 |
| 5,284,822 A | * | 2/1994 | Sakai et al. .............. 505/120 |
| 5,306,700 A | * | 4/1994 | Hojaji ...................... 505/450 |
| H1399 H | * | 1/1995 | Kozlowski et al. ....... 505/452 |
| 5,430,014 A | | 7/1995 | Soltner et al. |
| 5,525,584 A | * | 6/1996 | Murakami et al. ....... 505/450 |
| 5,696,392 A | | 12/1997 | Char et al. |
| 5,998,050 A | | 12/1999 | Yamada et al. |
| 6,136,756 A | | 10/2000 | Langbein et al. |
| 6,191,073 B1 | | 2/2001 | Hojczyk et al. |
| 6,221,812 B1 | | 4/2001 | Zhou et al. |
| 6,256,521 B1 | | 7/2001 | Lee et al. |
| 6,383,989 B2 | | 5/2002 | Jia et al. |
| 2001/0056041 A1 | | 12/2001 | Jia et al. |

* cited by examiner

*Primary Examiner*—Michael Cleveland
(74) *Attorney, Agent, or Firm*—Richard A. Lambert; Bobby D. Scearce; Thomas L. Kundert

(57) ABSTRACT

A method of manufacturing a high temperature superconductor is disclosed. The method includes depositing, by pulsed laser deposition, alternating layers of $YBa_2Cu_3O_{7-x}$ (Y123) and $Y_2BaCuO_{5-y}$ (Y211). The Y211 layers are characterized by a multiplicity of nanosized globular inclusions, effectively enhancing flux pinning and thus increasing current transport.

14 Claims, 2 Drawing Sheets

METHOD OF MANUFACTURING A HIGH TEMPERATURE SUPERCONDUCTOR

The present application is related to and claims priority on prior copending provisional Application No. 60/355,994, filed Feb. 8, 2002, entitled "Flux Pinning of High Temperature Superconductors by Multi-Layered Deposition".

RIGHTS OF THE GOVERNMENT

The invention described herein may be manufactured and used by or for the Government of the United States for all governmental purposes without the payment of any royalty.

BACKGROUND OF THE INVENTION

The present invention relates generally to a method of manufacturing a high temperature superconductor and more specifically to a pulsed laser deposition method of applying a plurality of alternating thin layers of non-superconducting material and superconducting material in high temperature superconductors.

The desirability of providing efficient high temperature superconductors for operation at 20° K and higher is well known. Indeed, there has been an enormous amount of experimental activity in these so called high temperature superconductors since research in the mid 1980s first demonstrated dramatic gains in raising the maximum critical transition temperatures from the 20° K range to the 90° K range.

In general, superconductors and superconducting material exhibit zero resistance when operating at temperatures below their maximum critical transition temperature. This quality of operating at zero resistance facilitates the construction and operation of highly efficient devices such as superconducting magnets, magnetic levitators, propulsion motors and magnetohydronamics, power generators, particle accelerators, microwave and infrared detectors, etc.

In addition to the quality of operating at zero resistance, superconductors display other, unusual characteristics. For example, a surprising effect of superconductivity is that magnetic flux is expelled from superconductors. This is commonly known as the Meissner or Meissner-Ochsenfeld effect. Other unexpected phenomena include current flow via electron pairs rather than individual electrons and large scale quantum behaviors such as flux quantization and flux tubes.

According to current accepted nomenclature, superconducting materials fall within two broad categories, Type I and Type II. The Type I materials are pure metallic elements. Type II materials are alloys or compounds and are characterized by their ability to retain superconductive attributes in the presence of applied magnetic fields. Unlike Type I materials, Type II materials tolerate some degree of applied magnetic flux intrusion into their interiors without destroying the superconducting state. More specifically, as applied flux and/or temperature increase, microscopic flux tubes or fluxons begin to develop within the material. In this mixed state of superconductivity, the material within the flux tubes is in a normal state of resistivity. The material surrounding the flux tubes remains in a state of superconductivity. Since the Type II materials will support mixed superconductivity at elevated temperatures and applied magnetic field intensities, the Type II materials seem to be the best candidates for, commercial application and further development.

More specifically, under equilibrium conditions, magnetic flux penetrates the; bulk of a type II superconductor above the lower critical field. Over most of the available magnetic field-temperature (H-T) space, H>Hc1, this magnetic flux exists as a lattice of quantized line vortices or fluxons. Each fluxon is a tube in which superconducting screening currents circulate around a small non-superconducting core. Bulk superconductivity is destroyed when the normal cores overlap at the upper critical field. In isotropic materials such as Nb—Ti and Nb3Sn, vortex lines are continuous, but the weak superconductivity of the blocking layers of High Temperature Superconducting (HTS) compounds produces a stack of weakly coupled 'pancake' vortices whose circulating screening currents are mostly confined within the superconducting $CuO_2$ planes. Superconductors can carry bulk current density only if there is a macroscopic fluxon density gradient. This gradient can be sustained only by pinning the vortices (flux pinning) at microstructural defects. Increasing T and H weaken the potential wells at which vortices are pinned. Flux pinning is determined by spatial perturbations of the free energy of the vortex lines due to local interactions of their normal cores and screening currents with these microstructural imperfections. The critical current density Jc (T, H) is then defined by the balance of the pinning and Lorentz forces. Ideally, a type II superconductor can carry any non-dissipative current density J smaller than Jc. When J exceeds Jc, a superconductor switches into a dissipative, vortex-flow state, driven by the Lorentz force.

High temperature superconducting generators and magnets are significantly lighter and more compact than their conventional counterparts. The development of these devices is of great importance especially in applications requiring compact lightweight, high power sources or compact high field magnets. HTS coated conductor can be used to make the coil windings in HTS generators as well as HTS magnet windings and thus long lengths of coated conductor with high current transport and lower ac losses are desirable.

Various attempts have been made to stabilize or pin the flux vortices within HTS conductors. Introducing impurities or defects into the superconducting material is a known way to provide flux pinning. Such flux pins can be holes, nanotubes, particles, grain boundaries or other defects intentionally introduced into the superconducting material.

Another, recent technique under investigation for introducing flux pinning mechanisms into superconducting materials is to create a coated HTS conductor including a series of layers that alternate between superconducting and non-superconducting materials. See, for example, U.S. Pat. No. 6,191,073 to Hojczyk et al. and U.S. Pat. No. 6,383,989 to Jia et al. (U.S. Patent Application Publication, US 2001/0056041)

While the known methods of improving current carrying capacity within highs temperature superconductors by introducing flux-pinning defects into the superconducting material have achieved some degree of success, they are not without the need for improvement. A need exists for an improved method of manufacturing a high temperature superconductor while concurrently implanting a flux-pinning mechanism therein. Such a method would be relatively simple and inexpensive to implement while providing improved current carrying capability at high temperatures and applied magnetic fields.

SUMMARY OF THE INVENTION

Accordingly, it is a primary object of the present invention to provide a method of manufacturing a high temperature superconductor overcoming the limitations and disadvantages of the prior art.

Another object of the present invention is to provide a method of manufacturing a high temperature superconductor providing a multilayered coated conductor having an effective flux pinning mechanism implanted therein.

Yet another object of the present invention is to provide a method of manufacturing a high temperature superconductor that can be readily implemented using known pulsed laser deposition equipment.

Still another object of the present invention is to provide a method of manufacturing a high temperature superconductor that alternately combines a layer of superconducting material with a layer of non-superconducting material, wherein the layer of non-superconducting material is a multiplicity of nanosized globular inclusions of material rather than a uniform layer.

It is still another object of the present invention to provide a method of manufacturing a high temperature superconductor that incorporates alternating layers of superconducting material interspersed with layers of non-superconducting material characterized by a multiplicity of nanosized globular inclusions wherein the material comprising the non-superconducting layer is not chemically reactive with the superconducting material.

It is yet another object of the present invention to provide a method of manufacturing a high temperature superconductor utilizing superconducting $YBa_2Cu_3O_{7-x}$ (Y123) and non-superconducting $Y_2BaCuO_{5-y}$ (Y211).

These and other objects of the invention will become apparent as the description of the representative embodiments proceeds.

In accordance with the foregoing principles and objects of the invention, a method of manufacturing a high temperature superconductor utilizing pulsed laser deposition is described. The method of the present invention can be used to fabricate high temperature superconductors using known pulsed laser deposition equipment and techniques.

As can be seen, it is desirable to pin magnetic flux within high temperature superconductors to improve current transport at higher fields. One technique is to add a high density (number) of non-superconducting defects into the superconducting material, for example, $\sim 0.5 \times 10^{11}$ M cm$^{-2}$ or $\sim 5$ per 100 nm in a linear direction to pin a 5 T field (M being the magnetic field strength in Tesla). This pinning defect should be greater than or equal to the coherence length of the HTS material which, in the case of $YBa_2Cu_3O_{7-x}$ is in the range of about 1–2 nm. This can become problematic, however, in that many compounds diffuse and react with the HTS material during high temperature processing when the layer thickness is ~1 nm. This leads to degradation of performance and efficiency of the completed HTS conductor.

Advantageously, the method of manufacturing a high temperature superconductor of the present invention utilizes a non-superconducting layer material that is not chemically reactive with the HTS material. This avoids the degradation of performance noted above.

According to the method of the present invention, $YBa_2Cu_3O_{7-x}$ and $Y_2BaCuO_{5-y}$ targets are placed within a pulsed laser deposition chamber. A substrate upon which the superconductor will be grown is also placed within the deposition chamber. The pulsed laser deposition system is placed into operation and a first layer of Y123 is grown upon the substrate by irradiating the $YBa_2Cu_3O_{7-x}$ target with the emission from the pulsed laser. The process is allowed to continue until a layer of superconducting Y123 is deposited to a thickness of about 7–10 nm. Next, a layer of Y211 is grown upon the layer of Y123 by irradiating the $Y_2BaCuO_{5-y}$ target with the emission from the pulsed laser. The process is allowed to continue until a layer of non-superconducting Y211 is deposited to a thickness equal to or exceeding the coherence length of the material, here ~1–2 nm. The layer of Y211 is characterized by a multiplicity of; nanosized globular inclusions, effectively enhancing the flux pinning nature of the Y211 layer. The process is then repeated until a multilayered superconductor is fabricated.

BRIEF DESCRIPTION OF THE DRAWING

The accompanying drawing incorporated in and forming a part of the specification, illustrates several aspects of the present invention and together with the description serves to explain the principles of the invention. In the drawing.

DETAILED DESCRIPTION OF THE INVENTION

Figure 1:
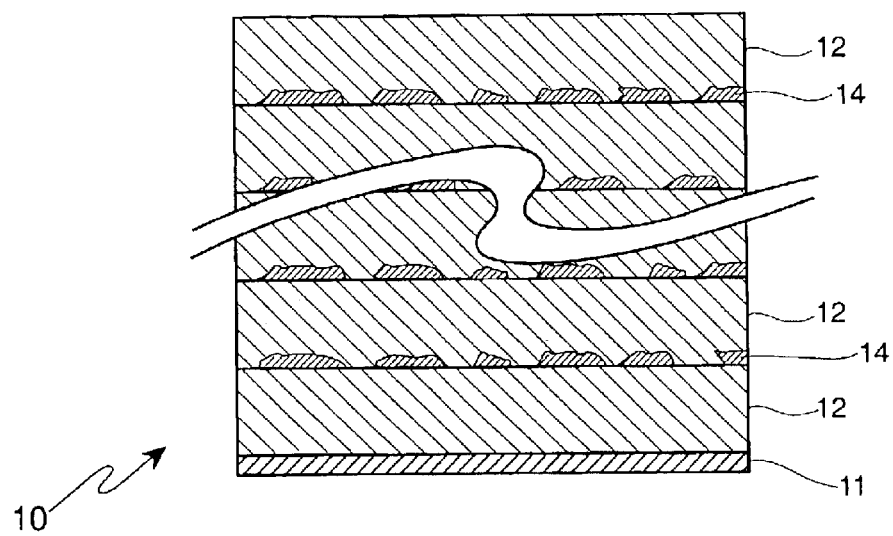
FIG. 1 is a cross sectional representation of the HTS conductor fabricated according to the method of the present invention; and, FIG. 2 is a graph illustrating the results of testing performed on a HTS conductor fabricated according to the method of the present invention.

Reference is made to the drawing figures showing the high temperature superconductor 10 fabricated according to the method of the present invention. The method of the present invention can be used to fabricate high temperature superconductors using known pulsed laser deposition equipment and techniques and the superconductors thus made exhibit dramatically increased current transport.

Advantageously, the method of the present invention is used to fabricate High Temperature Superconducting (HTS) coated conductors while concurrently implanting a flux-pinning mechanism implanted therein. The desirability of providing flux-pinning centers within high temperature superconductors to improve current transport at higher fields is known. Introducing impurities or defects into the superconducting material, is a known way to provide flux pinning. Such flux pins can be holes, nanotubes, particles grain boundaries or other defects intentionally introduced into the superconducting material. One technique of implanting flux-pinning mechanisms is to add a high density (number) of non-superconducting defects into the superconducting material, for example, $\sim 0.5 \times 10^{11}$ M cm$^{-2}$ or $\sim 5$ per 100 nm in a linear direction to pin a 5 T field, where M is the magnetic field strength in Tesla. This pinning defect must be greater than or equal to the coherence length of the HTS material which, in the case of $YBa_2Cu_3O_{7-x}$ (Y123) is in the range of about 1–2 nm. This approach is problematic because many compounds diffuse and react with the HTS material during high temperature processing when the layer thickness is ~1 nm, leading to degradation of performance and efficiency of the completed HTS conductor.

Advantageously, the method of manufacturing a high temperature superconductor of the present invention incorporates the use of a non-superconducting material that is not chemically reactive with the HTS material. The avoidance of compound reactions provides for the implantation of an effective flux-pinning mechanism by assuring that the non-superconducting layer of material is uniform.

According to the method of the present invention, $YBa_2Cu_3O_{7-x}$ (Y123) and $Y_2BaCuO_{5-y}$ (Y211) targets are placed within a pulsed laser deposition chamber. Pulsed laser deposition systems are commercially available or they can be made in-house. One commercial supplier of pulsed laser deposition systems suitable for v performing the steps of the present invention is Neocera, Inc., Beltsville, Md. A substrate upon which the superconductor will be grown is also placed within the deposition chamber. The substrate can be chosen from a variety of materials such as a single crystal, buffered metallic or non-metallic textured substrate such that allow epitaxial growth of $YBa_2Cu_3O_{7-x}$.

In general, pulsed laser deposition systems include a deposition chamber wherein the pulsed laser deposition process is performed. A vacuum pump is provided to evacuate the deposition chamber to various levels to accommodate the deposition process. As will be described in more detail below, a pulsed laser is used to irradiate a target within the deposition chamber in order to deposit the material on the substrate. The laser is typically pulsed at nanosecond rates. The interaction of the nanosecond laser radiation with condensed matter results primarily in the ejection of atomic species from the solid target. If this is done in a good vacuum, the ejected atoms leave the target with hyperthermal energies and continue their rectilinear trajectories until they strike an appropriate substrate.

According to the method of the present invention, the pulsed laser deposition system is placed into operation by establishing an appropriate vacuum within the deposition chamber. A first layer 12 of Y123 is grown upon the substrate 11 by irradiatiating the Y123 target with the emission from the pulsed laser. The process is allowed to continue until the layer 12 of superconducting Y123 is deposited to a thickness of about 7–10 nm.

Next, a layer 14 of non-superconducting Y211 is grown upon the layer of, Y123. Advantageously, the layers 14 of Y211 are characterized by a multiplicity of nanosized, globular inclusions of Y211 rather than a uniform layer. This has been demonstrated experimentally to provide a large improvement of JC(H) by flux pinning, see FIG. 2. Moreover, the Y211 inclusions may exhibit preferred orientation regardless of Y123 thickness. Other choices of non-superconducting material in lieu of Y211 include, but are not considered limited to, silver, gold, platinum, CeO2, GdO2, Y2O3 and MgO.

The deposition process is allowed to continue until the layer 14 of non-superconducting Y211 characterized by a multiplicity of globular inclusions is deposited to a thickness equal to or exceeding the coherence length of the material, here ~1–2 nm. The Y211 phase is chemically stable with the Y123 phase, assuring a uniform implantation of the flux pinning mechanism. The process described above is then repeated until a multilayered superconductor is fabricated. The number of layers is believed to be in the range of about 10 up to several hundred for providing an effective HTS coated conductor.

Figure 2:
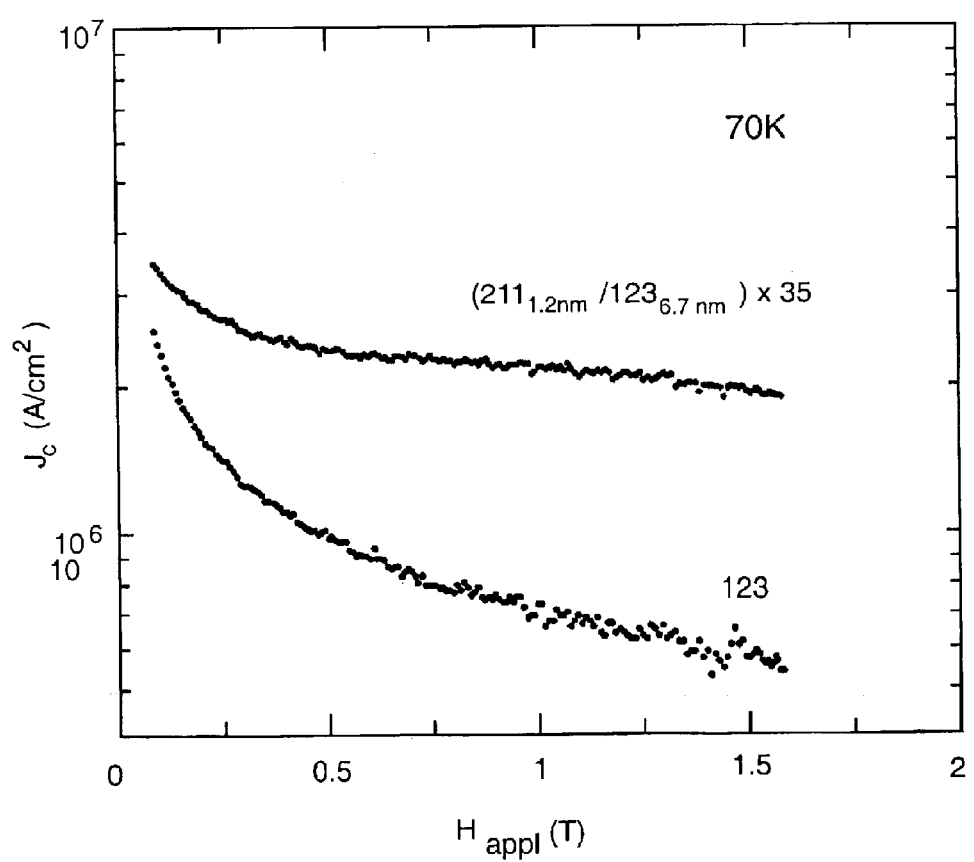

The advantages of utilizing the method of the present invention have been borne out by experimentation. Reference is made to FIG. 2 wherein the increase in current transport within a multilayer conductor fabricated according to the method of the present invention versus a Y123 film is illustrated. In this example, the laser used was a KrF (248 nm) excimer laser. The vacuum level was 300 mTorr of $O_2$ pressure and a 785° substrate temperature. Approximately 70 alternating layers were deposited of Y211 (~1.5 nm thickness) with Y123 (~7 nm thickness) for a total film thickness of about 0.3 micron. Following deposition, the film was cooled and annealed at 500° in 1 atm of $O_2$. The pinning properties were measured in magnetic fields up to 1.8 T using a Vibrating Sample Magnetometer.

In summary, numerous benefits have been described from utilizing the principles of the present invention. A method of manufacturing a high temperature superconductor is disclosed for providing a multilayer superconductor having alternating layers of non-superconducting Y211 and superconducting Y123. The layers 14 of Y211 are characterized by a multiplicity of nanosized globular inclusions, which advantageously provide effective flux pinning and dramatically enhanced current transport.

The foregoing description of the preferred embodiment has been presented for purposes of illustration and description. It is not intended to be exhaustive or to limit the invention to the precise form disclosed. Obvious modifications or variations are possible in light of the above teachings. For example, the method of the present invention could be utilized with other materials besides YBCO. And, the layers could be grown in reverse order wherein the Y211 layer is first deposited upon the substrate and the Y123 layer is next applied thereon. The embodiment was chosen and described to provide the best illustration of the principles of the invention and its practical application to thereby enable one of ordinary skill in the art to utilize the inventions in various embodiments and with various modifications as are suited to the particular scope of the invention as determined by the appended claims when interpreted in accordance with the breadth to which they are fairly, legally and equitably entitled.

We claim:

1. A pulsed laser deposition method of manufacturing a high temperature superconductor while concurrently implanting a flux-pinning mechanism therein, comprising the steps of:

providing a pulsed laser deposition chamber including a pulsed laser;

placing $YBa_2Cu_3O_{7-x}$ and $Y_2BaCuO_{5-y}$ targets within said chamber;

placing a substrate within said chamber;

forming, by pulsed laser deposition, a superconducting layer of $YBa_2Cu_3O_{7-x}$ uniformly upon said substrate by irradiating said $YBa_2Cu_3O_{7-x}$ target with the emission of said pulsed laser;

depositing, by pulsed laser deposition, a non-superconducting layer of $Y_2BaCuO_{5-y}$ by irradiating said $Y_2BaCuO_{5-y}$ target with the emission of said pulsed laser, said non-superconducting layer of $Y_2BaCuO_{5-y}$ being characterized by a multiplicity of nanosized globular inclusions;

covering said layer of $Y_2BaCuO_{5-y}$ with another layer of superconducting $YBa_2Cu_3O_{7-x}$ by irradiating said $YBa_2Cu_3O_{7-x}$ target with the emission of said pulsed laser; and, repeating said depositing and said covering steps to fabricate a multilayered superconductor.

2. The method of claim 1 wherein said multilayered superconductor is in the range of about 10–800 layers.

3. The method of claim 1 wherein said layers of non-superconducting $Y_2BaCuO_{5-y}$ are about 1–5 nm thick.

4. The method of claim 1 wherein said superconducting layers of $YBa_2Cu_3O_{7-x}$ are about 5–15 nm thick.

5. A pulsed laser deposition method of manufacturing a high temperature superconductor while concurrently implanting a flux-pinning mechanism therein, comprising the steps of:

providing a pulsed laser deposition chamber including a pulsed laser;

placing a $YBa_2Cu_3O_{7-x}$ target within said chamber;

placing a non-superconducting material target within said chamber;

placing a substrate within said chamber;

forming, by pulsed laser deposition, a superconducting layer of $YBa_2Cu_3O_{7-x}$ uniformly upon said substrate by irradiating said $YBa_2Cu_3O_{7-x}$ target with the emission of said pulsed laser;

depositing, by pulsed laser deposition, a layer of non-superconducting material upon said substrate by irradiating said non-superconducting material target with the emission of said pulsed laser, said layer of non-superconducting material being characterized by a multiplicity of nanosized globular inclusions;

covering said layer of non-superconducting material with another layer of superconducting $YBa_2Cu_3O_{7-x}$ by irradiating said $YBa_2Cu_3O_{7-x}$ target with the emission of said pulsed laser; and, repeating said depositing and said covering steps to fabricate a multilayered superconductor.

6. The method of claim 5 wherein said non-superconducting material is from the group of $Y_2BaCuO_{5-y}$ silver, gold, platinum, CeO2, GdO2, Y2O3 and MgO.

7. The method of claim 5 wherein said multilayered superconductor is in the range of about 10–800 layers.

8. A pulsed laser deposition method of manufacturing a high temperature superconductor while concurrently implanting a flux-pinning mechanism therein, comprising the steps of:

providing a pulsed laser deposition chamber including a pulsed laser;

placing $YBa_2Cu_3O_{7-x}$ and $Y_2BaCuO_{5-y}$ targets within said chamber;

placing a substrate within said chamber;

forming, by pulsed laser deposition, a non-superconducting layer of $Y_2BaCuO_{5-y}$ upon said substrate by irradiating said $Y_2BaCuO_{5-y}$ target with the emission of said pulsed laser, said non-superconducting layer of $Y_2BaCuO_{5-y}$ being characterized by a multiplicity of nanosized globular inclusions;

depositing, by pulsed laser deposition, a superconducting layer of $YBa_2Cu_3O_{7-x}$ uniformly upon said layer of $Y_2BaCuO_{5-y}$ by irradiating said $YBa_2Cu_3O_{7-x}$ target with the emission of said pulsed laser;

covering said layer of $YBa_2Cu_3O_{7-x}$ with another layer of non-superconducting $Y_2BaCuO_{5-y}$ by pulsed laser deposition by irradiating said $Y_2BaCuO_{5-y}$ target with the emission of said pulsed laser, said another layer of non-superconducting $Y_2BaCuO_{5-y}$ being characterized by a multiplicity of nanosized globular inclusions; and, repeating said depositing and said covering steps to fabricate a multilayered superconductor.

9. The method of claim 8 wherein said multilayered superconductor is in the range of about 10–800 layers.

10. The method of claim 8 wherein said layers of non-superconducting $Y_2BaCuO_{5-y}$ are about 1–5 nm thick.

11. The method of claim 8 wherein said superconducting layers of $YBa_2Cu_3O_{7-x}$ are about 5–15 nm thick.

12. A pulsed laser deposition method of manufacturing a high temperature superconductor while concurrently implanting a flux-pinning mechanism therein, comprising the steps of:

providing a pulsed laser deposition chamber including a pulsed laser;

placing a $YBa_2Cu_3O_{7-x}$ target within said chamber;

placing a non-superconducting material target within said chamber;

placing a substrate within said chamber;

forming, by pulsed laser deposition, a layer of non-superconducting material upon said substrate by irradiating said non-superconducting material target with the emission of said pulsed laser, said layer of non-superconducting material being, characterized by a multiplicity of nanosized globular inclusions;

depositing, by pulsed laser deposition, a superconducting layer of $YBa_2Cu_3O_{7-x}$ uniformly upon said layer of non-superconducting material by irradiating said $YBa_2Cu_3O_{7-x}$ target with the emission of said pulsed laser;

covering said layer of $YBa_2Cu_3O_{7-x}$ with another layer of non-superconducting material by pulsed laser deposition by irradiating said non-superconducting material target with the emission of said pulsed laser, said another layer of non-superconducting material being characterized by a multiplicity of nanosized globular inclusions; and, repeating said depositing and said covering steps to fabricate a multilayered superconductor.

13. The method of claim 12 wherein said non-superconducting material is from the group of $Y_2BaCuO_{5-y}$ silver, gold, platinum, CeO2, GdO2, Y2O3 and MgO.

14. The method of claim 12 wherein said multilayered superconductor is in the range of about 10–800 layers.

* * * * *